United States Patent
Tanaka et al.

(10) Patent No.: US 6,538,936 B2
(45) Date of Patent: Mar. 25, 2003

(54) SEMICONDUCTOR INTEGRATED CIRCUIT HAVING TEST CIRCUIT

(75) Inventors: Koji Tanaka, Hyogo (JP); Goro Hayakawa, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/887,167

(22) Filed: Jun. 25, 2001

(65) Prior Publication Data

US 2002/0080667 A1 Jun. 27, 2002

(30) Foreign Application Priority Data

Dec. 25, 2000 (JP) ................................. 2000-392740(P)

(51) Int. Cl.[7] ............................................. G11C 7/00
(52) U.S. Cl. ................................ 365/201; 365/226
(58) Field of Search ................................ 365/201, 204, 365/226, 149, 189.09; 327/536, 537, 589, 437; 307/110

(56) References Cited

U.S. PATENT DOCUMENTS

| | | | | |
|---|---|---|---|---|
| 5,920,226 A | * | 7/1999 | Mimura | 327/535 |
| 5,943,282 A | * | 8/1999 | Iwata et al. | 365/204 |
| 6,020,781 A | * | 2/2000 | Fujioka | 327/142 |
| 6,023,187 A | * | 2/2000 | Camacho et al. | 327/536 |
| 6,373,322 B2 | * | 4/2002 | Kobayashi et al. | 327/536 |

* cited by examiner

*Primary Examiner*—Michael S. Lebentritt
*Assistant Examiner*—Anh Phung
(74) *Attorney, Agent, or Firm*—McDermott, Will & Emery

(57) ABSTRACT

A pump circuit forming a boosted power supply (Vpp) generating circuit includes: first and second pumps generating a boosted power supply; and a test circuit controlling levels of stress applied to the first and second pumps in accordance with a signal input from a ring oscillator and a test signal. A semiconductor memory device of the present invention enables application of a desired level of stress to each capacitor of the pump circuit formed for a stress test, and provides enhanced efficiency of the stress test and increased reliability of the semiconductor integrated circuit.

10 Claims, 12 Drawing Sheets

| SIGNAL | NORMAL OPERATION | TEST MODE | |
|---|---|---|---|
| TM1 | "L" | "H" | "L" |
| TM2 | "L" | "L" | "H" |
| N1 | "H"/"L" | "H" | "L" |
| N2 | "H"/"L" | "L" | "H" |

| SIGNAL | NORMAL OPERATION | TEST MODE | |
|---|---|---|---|
| TM1 | "L" | "H" | "H"/"L" |
| TM2 | "L" | "L" | "H" |
| N7 | "H"/"L" | "H" | "L" |
| N8 | "H"/"L" | "H" | "L" |

SEMICONDUCTOR INTEGRATED CIRCUIT HAVING TEST CIRCUIT

BACKGROUND OF THE INVENTION

1. Field of the Invention

The present invention relates to a semiconductor integrated circuit and, more particularly to a structure of a boosted power supply generating circuit.

2. Description of the Background Art

Conventionally, for a semiconductor integrated circuit such as a DRAM (Dynamic Random Access Memory), a boosted power supply has been widely used to eliminate the influence of a threshold voltage of a transistor. In the DRAM, a boosted power supply Vpp is primarily used as a word line voltage or the like.

FIG. 14 is a block diagram showing a boosted power supply generating circuit 500 (hereinafter referred to as a Vpp generating circuit).

Vpp generating circuit 500 includes a detector circuit 100, a ring oscillator circuit 200, and a pump circuit 300.

Detector circuit 100 detects any decrease in its voltage below a prescribed level due to current consumption of the semiconductor integrated circuit or the like for generating a signal Φ1 in generating Vpp.

An exemplary ring oscillator circuit 200 is shown in FIG. 15.

Ring oscillator circuit 200 includes an NAND circuit 201, a delay circuit 206 having inverters 202 to 205 connected in series, and an inverter 207.

Ring oscillator circuit 200 receives signal Φ1 for repeatedly generating pulse signal Φ2.

An exemplary pump circuit 300 is shown in FIG. 16.

Pump circuit 300 includes capacitors 301, 302, and 303, an inverter 304, and N channel transistors 305, 306, 307, and 308.

In pump circuit 300, capacitor 301 is arranged between nodes N1 and N3. N channel transistor 305 is arranged between an external power supply source Ext. Vcc (hereinafter referred to as Vcc) and node N3, having its gate connected to external power supply source Vcc. N channel transistor 306 is arranged between external power supply source Vcc and node N4, having its gate connected to node N3. N channel transistor 307 is arranged between external power supply source Vcc and node N5, having its gate connected to node N3. Inverter 304 is arranged between nodes N1 and N2. Capacitor 302 is arranged between nodes N2 and N5. Capacitor 303 is arranged between nodes N2 and N4. N channel transistor 308 is arranged between nodes N4 and N6, having its gate connected to node N5. Vpp is supplied to each portion of the circuit from node N6.

Pump circuit 300 receives output signal Φ2 from ring oscillator circuit 200 for generating Vpp by a pumping operation of capacitors 301, 302, and 303.

The operation of Vpp generating circuit 500 shown in FIG. 14 will be described with reference to a time chart of FIG. 17.

Detector circuit 100 is set to output signal Φ1 at "L" if its voltage is at a desired level (at or higher than a detection level) in generating Vpp.

Detector circuit 100 detects any decrease in Vpp below a prescribed level due to power consumption of the semiconductor integrated circuit, and outputs signal Φ1 at "H."

If the decrease in Vpp is detected, output signal Φ1 at "H" is input from detector circuit 100, and therefore ring oscillator circuit 200 repeatedly outputs pulse signal Φ2 at "H" in response to input signal Φ1 at "H" until Vpp attains to a prescribed level by a pumping operation which will later be described (FIG. 17 shows that one pumping operation restores Vpp).

If no decrease in Vpp is detected, output signal Φ1 at "L" is input from detector circuit 100, and therefore ring oscillator circuit 200 outputs signal Φ2 at "L."

At the time, in pump circuit 300, node N1 is at "L," and node N2 is at "H" because of inverter 304.

Node N3 is precharged to a level of power supply voltage Vcc−Vth (Vth is a threshold voltage of N channel transistor 305), and capacitor 301 is charged.

Nodes N4 and N5 are at a level of Vcc−2Vth (Vth is a threshold voltage of N channel transistors 306 and 307).

If detector circuit 100 detects any decrease in Vpp, it outputs signal Φ1 at "H."

Ring oscillator circuit 200 operates in response to signal Φ1 at "H," and outputs signal Φ2 at "H."

At the time, node N1 is at "H," and the pumping operation of capacitor 301 brings node N3 to a level of 2Vcc−Vth, so that N channel transistors 306 and 307 are fully turned on.

Node N2 attains from "H" to "L" because of inverter 304.

Thus, although the voltage levels at nodes N4 and N5 temporarily decrease, they are precharged to the Vcc level when N channel transistors 306 and 307 are turned on.

Thus, capacitors 302 and 303 are charged to the Vcc level.

Subsequently, when output signal Φ2 from ring oscillator circuit 200 attains to "L," node N2 attains to "H" because of inverter 304.

The pumping operation of capacitors 302 and 303 causes nodes N4 and N5 to attain to the 2Vcc level.

Then, N channel transistor 308 is turned on and electric charges are supplied to node N6. As a result, the voltage level at node N6 rises.

A stress test is performed on a semiconductor integrated circuit to assure reliability, in which a high electric field is applied to an oxide film. In the above described Vpp generating circuit, reliability of capacitors 301, 302, and 303 must also be assured. In a stress test mode, the semiconductor integrated circuit is maintained in a stand-by mode and detector circuit 100 is inactivated by a Test signal shown in FIG. 14. At the time, output signals Φ1 and Φ2, respectively from detector circuit 100 and ring oscillator circuit 200, are both at "L." Thus, in the stress test mode, nodes N1 and N2 of the pump circuit 300 are always at "L" and "H," respectively. Accordingly, capacitors 302 and 303 are subject to weaker stress as compared with capacitor 301.

Having the above described structure, Vpp generating circuit 500 of a conventional semiconductor integrated circuit suffers from a problem that a desired level of stress cannot be applied to each capacitor in the pump circuit in a stress test mode for assuring reliability.

SUMMARY OF THE INVENTION

The present invention provides a Vpp generating circuit which ensures that a capacitor is reliably tested.

A semiconductor integrated circuit of the present invention includes: a plurality of memory cells arranged in a matrix; a memory cell array region having a plurality of word lines arranged corresponding to rows; and a plurality of bit lines arranged corresponding to columns; a pump circuit generating by a plurality of capacitors a boosted voltage supplied to the memory cell array region; and a test circuit controlling a level of stress applied to the plurality of capacitors in the pump circuit.

Preferably, the test circuit is controlled by a test signal.

Particularly, the test signal controls levels of stress applied to the plurality of capacitors.

According to the above described semiconductor integrated circuit, a desired level of stress can be applied to each capacitor in the pump circuit in a stress test mode, so that the semiconductor integrated circuit is provided with enhanced reliability.

Particularly, the test circuit controls the levels of stress applied to the plurality of capacitors simultaneously by the test signal.

According to the semiconductor integrated circuit of the present invention, desired levels of stress can be simultaneously applied to capacitors of the pump circuit in the stress test, so that the efficiency of the stress test and the reliability of the semiconductor integrated circuit increases.

Particularly, the test signal is input from an external signal pin.

Particularly, the test signal is input from an external pad.

Preferably, there is further provided a test signal generating circuit for internally generating the test signal.

Particularly, the test signal generating circuit generates a test signal in response to input from the external signal pin.

Particularly, the test signal generating circuit generates the test signal in response to input from the external pad.

According to the semiconductor integrated circuit of the present invention, the input test signal is generated from the external pad, external signal pin, or internally from test signal generating circuit.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
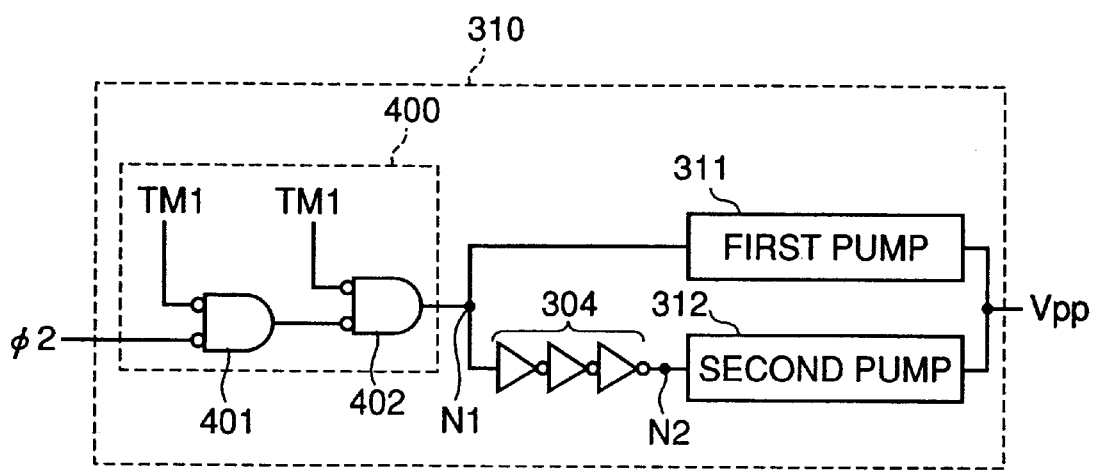
FIG. 1 is a diagram showing a pump circuit according to a first embodiment of the present invention.

Embodiments of the present invention will be described in detail with reference to the drawings. It is noted that the same or corresponding portions are denoted by the same reference characters and description thereof will not be repeated.

First Embodiment

FIG. 1 shows a pump circuit 310 forming a Vpp generating circuit according to the first embodiment of the present invention.

Pump circuit 310 includes a test circuit 400, a first pump 311, a second pump 312, and an inverter 304 arranged between nodes N1 and N2.

Test circuit 400 includes: an NOR circuit 401 receiving a test signal TM1 and an output signal Φ2 from ring oscillator circuit 200; and an NOR circuit 402 receiving an output signal from NOR circuit 401 and a test signal TM2.

Test circuit 400 controls output signal Φ2 from ring oscillator circuit 200 in accordance with a test signal.

An output from the test circuit (an output from NOR circuit 402) is supplied (input) to node N1. By inputting a signal from node N1 and a signal from node N2 (an inversion of a signal at node N1) respectively to first and second pumps 311 and 312, the level of stress applied to each pump is controlled.

Each of first and second pumps 311 and 312 includes a capacitor.

In the present invention, a desired level of stress is applied to each capacitor in a stress test mode by test circuit 400. Namely, a prescribed voltage difference is applied between polar plates of each capacitor.

Figure 2:
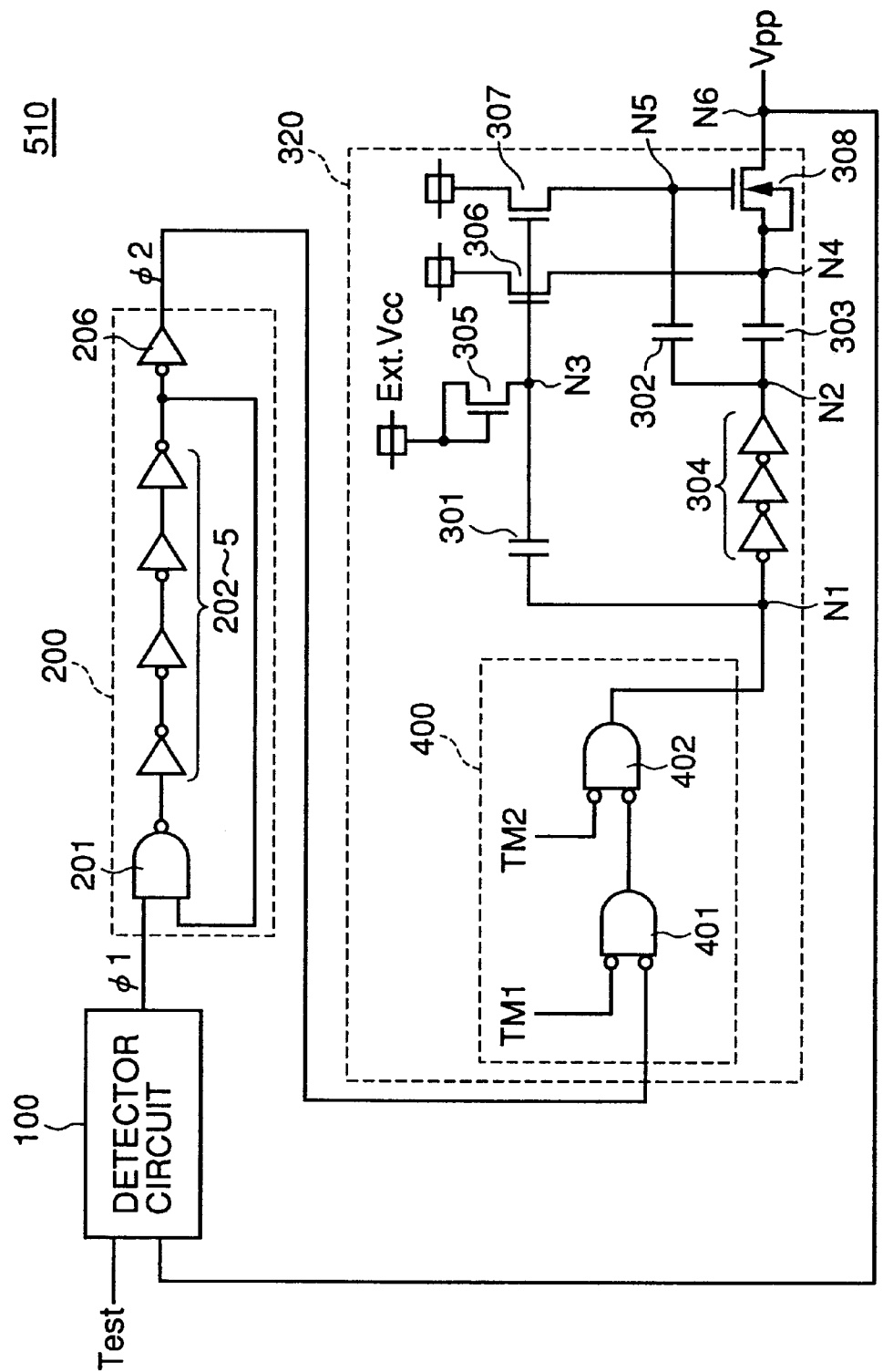
FIG. 2 is a diagram showing a Vpp generating circuit according to the first embodiment of the present invention.

FIG. 2 shows an arrangement of Vpp generating circuit 510 of the present invention. In FIG. 2, pump circuit 320 is shown as an illustrative example of pump circuit 310.

Vpp generating circuit 510 includes a detector circuit 100, a ring oscillator circuit 200, and a pump circuit 320.

Pump circuit 320 includes a test circuit 400, capacitors 301 to 303, transistors 305 to 308, and an inverter 304.

The relationship among capacitors 301 to 303, transistors 305 to 308, and inverter 304 is as described above.

The operation of pump circuit 320 of the present invention will be described with reference to a table of FIG. 3, which is shown in conjunction with the operation of the pump circuit.

In a normal operation, if test signals TM1 and TM2 are both at "L," input signal Φ2 of test circuit 400 is directly input to node N1.

In a stress test mode, test signals TM1 and TM2 are controlled to have a combination of levels that controls the voltage levels at nodes N1 and N2.

Namely, if test signals TM1 at "H" and TM2 at "L" are input, nodes N1 and N2 respectively attain to "H" and "L," so that stresses are applied to capacitors 302 and 303 shown in FIG. 2.

If test signals TM1 at "L" and TM2 at "H" are input, nodes N1 and N2 respectively attain to "L" and "H," so that a stress is applied to capacitor 301 shown in FIG. 2.

Figures 3, 4:
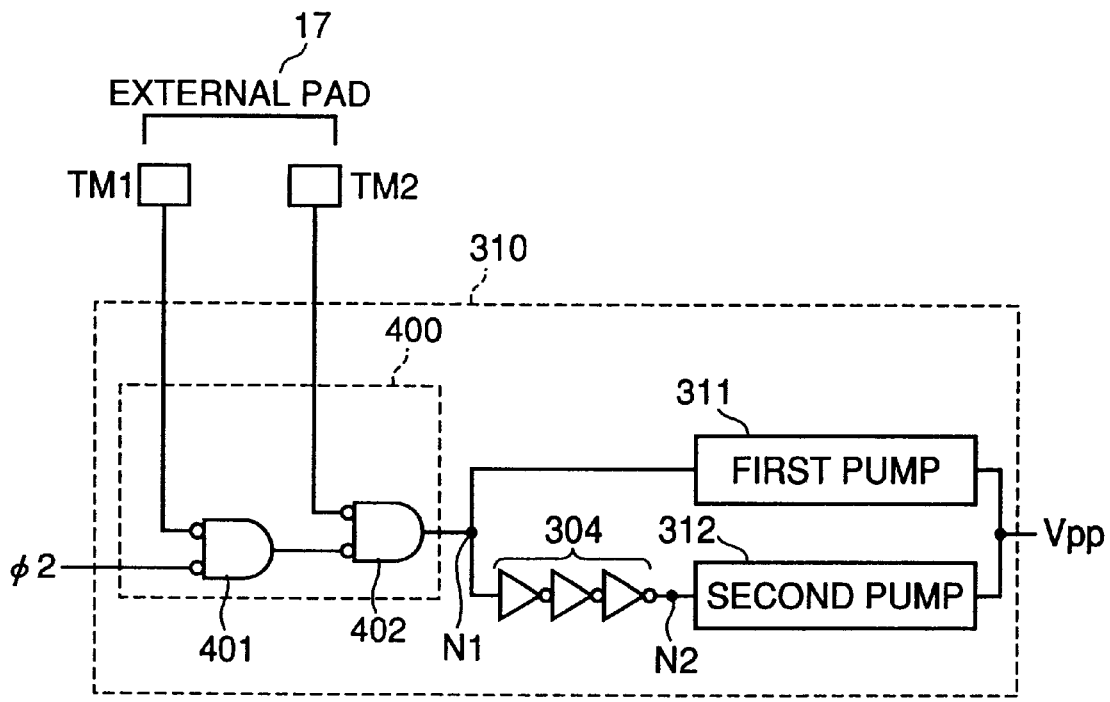
FIG. 3 is a table shown in conjunction with an operation of the pump circuit according to the first embodiment of the present invention.
FIGS. 4 and 5 are diagrams showing the pump circuit according to the first embodiment of the present invention.

As to a method of inputting test signals TM1 and TM2, if input is performed with respect to a wafer as shown in FIG. 4, these signals are input from an external pad 17.

Figure 5:
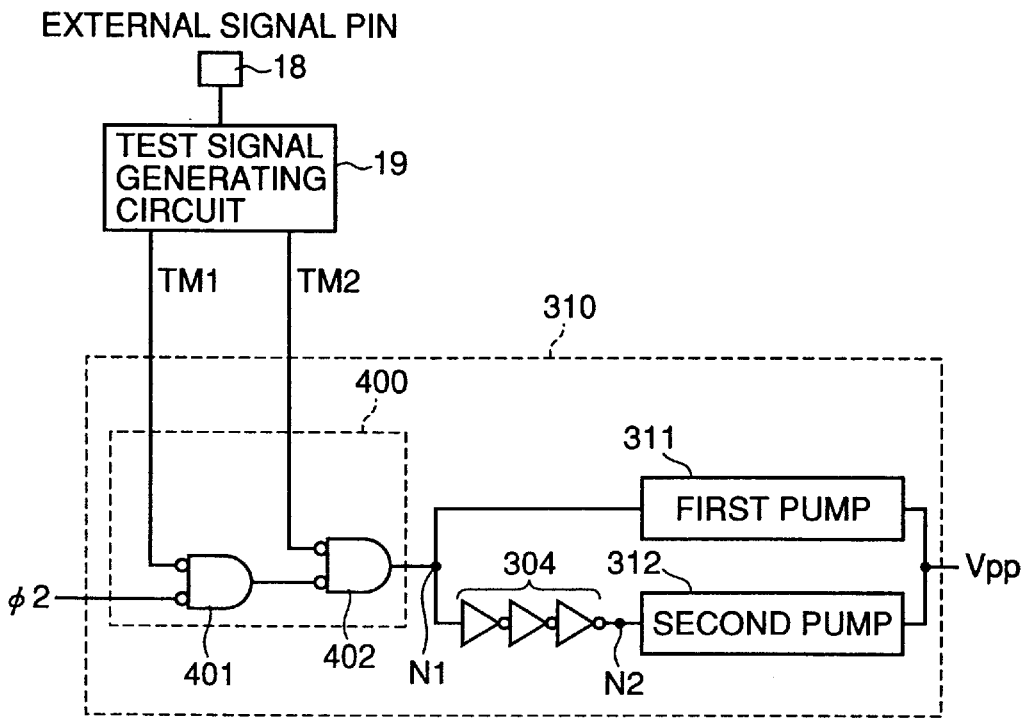

Alternatively, test signals TM1 and TM2 may be internally generated by test signal generating circuit 19 in accordance with an external signal received from external signal pin 18 as shown in FIG. 5.

Second Embodiment

Figure 6:
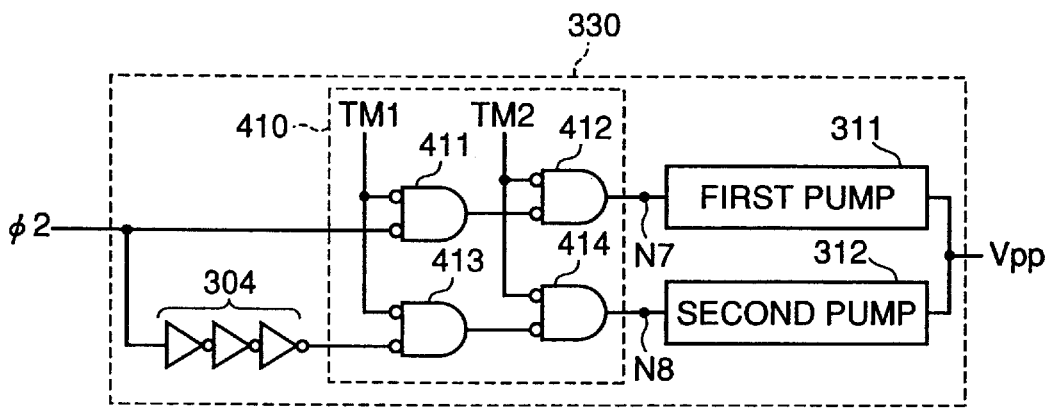
FIG. 6 is a diagram showing a pump circuit according to a second embodiment of the present invention.

FIG. 6 shows a pump circuit 330 forming a Vpp generating circuit according to the second embodiment of the present invention.

Pump circuit 330 includes a test circuit 410, a first pump 311, and a second pump 312, and an inverter 304. Inverter 304 outputs an inverted signal of output signal Φ2 from ring oscillator circuit 200.

Test circuit 410 includes: an NOR circuit 411 receiving a test signal TM1 and output signal Φ2 from ring oscillator circuit 200; an NOR circuit 412 receiving an output signal from NOR circuit 411 and test signal TM2; an NOR circuit 413 receiving test signal TM1 and an output signal from inverter 313; and an NOR circuit 414 receiving an output signal from NOR circuit 413 and test signal TM2.

An output from NOR circuit 412 is supplied to a node N7 electrically connected to first pump 311, whereas an output from NOR circuit 414 is supplied to a node N8 electrically connected to second pump 312.

Test circuit 410 uses a test signal for controlling the voltage levels at nodes N7 and N8, so as to control the level of stress applied to each pump.

The present invention provides for simultaneous application of desired levels of stress to capacitors in the stress test mode by test circuit 410.

Figure 7:
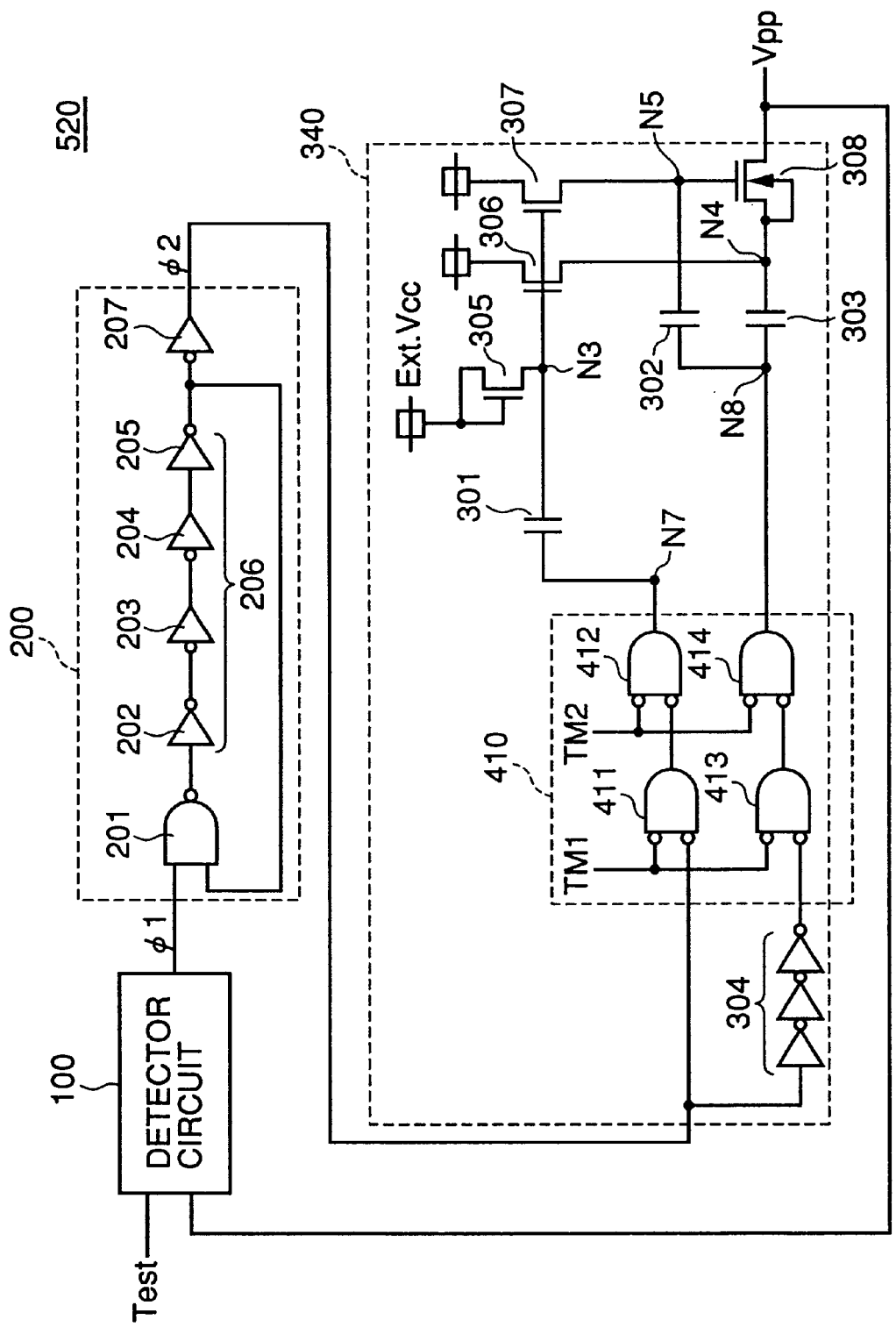
FIG. 7 is a diagram showing a Vpp generating circuit according to the second embodiment of the present invention.

FIG. 7 is a Vpp generating circuit 520 of the present invention that includes a pump circuit 340 as an illustrative example of pump circuit 330.

Vpp generating circuit 520 includes a detector circuit 100, a ring oscillator circuit 200, and a pump circuit 340.

Pump circuit 340 includes a test circuit 410, capacitors 301 to 303, transistors 305 to 308, and an inverter 304.

Capacitors 301 to 303 are connected to transistors 305 to 308 as described above. Inverter 304 is connected to NOR circuit 413 for inputting an inversion of output signal Φ2 from ring oscillator circuit 200 to test circuit 410.

In pump circuit 340, capacitor 301 is connected between nodes N7 and N3, capacitor 302 between nodes N8 and N5, and capacitor 303 between nodes N8 and N5.

The operation of pump circuit 340 of the present invention will be described with reference to a table of FIG. 8, which is shown in conjunction with the operation of the pump circuit.

In a normal operation, if test signals TM1 and TM2 are both at "L" as in the first embodiment, input signal Φ2 and its inversion are directly input to nodes N7 and N8.

In a stress test mode, test signals TM1 and TM2 are controlled to have a combination of levels that controls the voltage levels at nodes N7 and N8.

Namely, if test signal TM2 at "H" is input, nodes N7 and N8 both attain to "L" independent of test signal TM1, so that stresses are simultaneously applied to capacitors 301, 302, and 303 shown in FIG. 7.

Figures 8, 9:
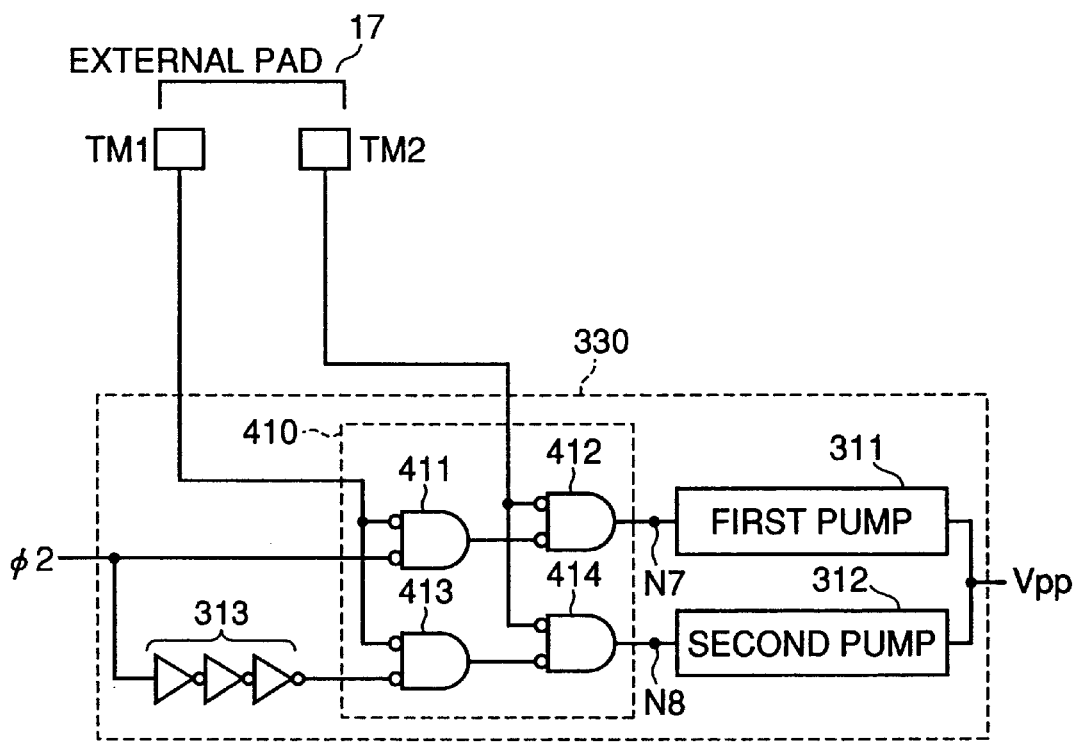
FIG. 8 is a table shown in conjunction with an operation of the pump circuit according to the second embodiment of the present invention.
FIGS. 9 and 10 are diagrams showing the pump circuit according to the second embodiment of the present invention.

As to a method of inputting test signals TM1 and TM2, if input is performed with respect to a wafer as shown in FIG. 9 as in the first embodiment, these signals are input from external pad 17.

Figure 10:
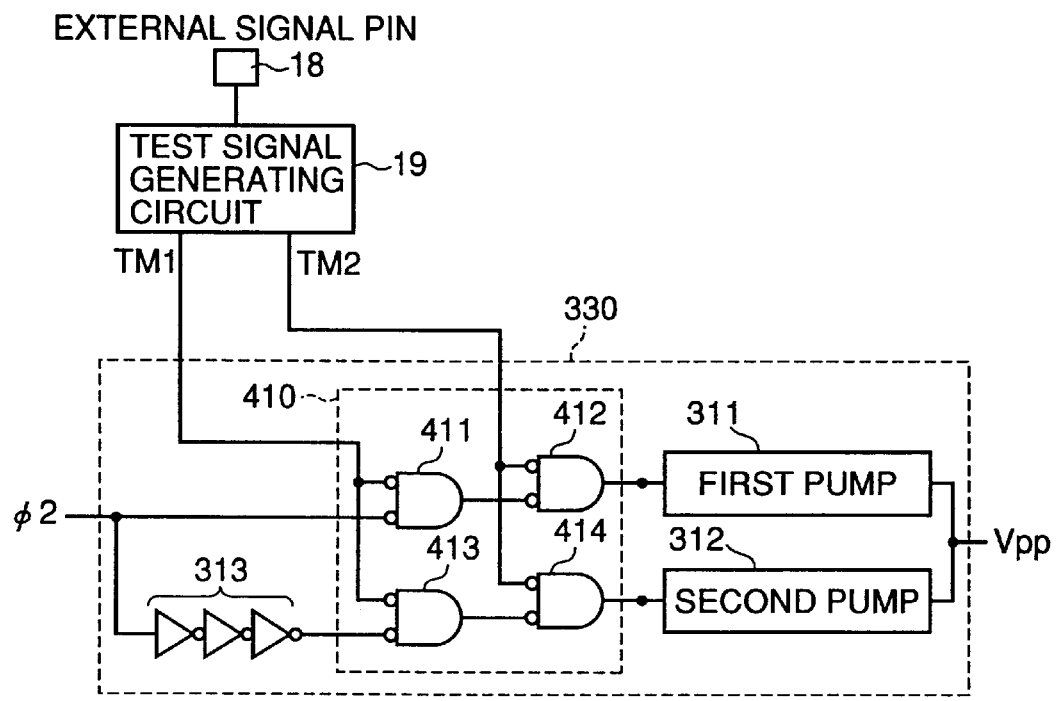

Alternatively, test signals TM1 and TM2 can be internally generated by test signal generating circuit 19 in accordance with an external signal from external signal pin 18 as shown in FIG. 10.

Figure 11:
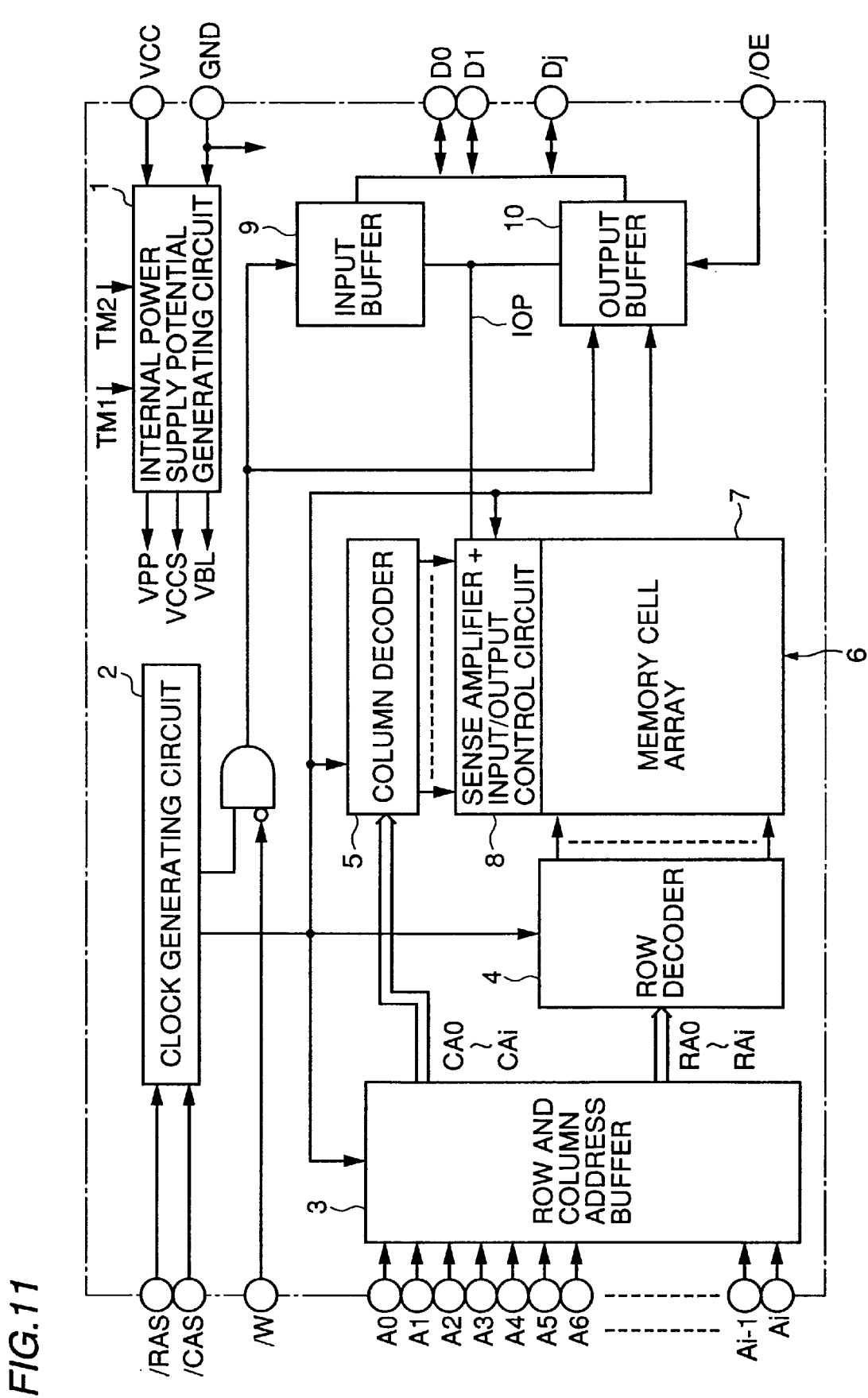
FIG. 11 is a block diagram showing a general arrangement of a DRAM of one embodiment of the present invention.

FIG. 11 is a block diagram showing an arrangement of a DRAM according to one embodiment of the present invention. Referring to FIG. 11, the DRAM includes: an internal power supply potential generating circuit 1; a clock generating circuit 2; a row and column address buffer 3; a row decoder 4; a column decoder 5; a memory mat 6; an input buffer 9; and an output buffer 10. Memory mat 6 includes a memory array 7 and a sense amplifier+input/output control circuit 8.

Internal power supply potential generating circuit 1 externally receives a power supply potential VCC and ground potential GND for generating internal power supply potentials VPP, VCCS, and VBL. Clock generating circuit 2 selects a prescribed operation mode in accordance with externally applied signals/RAS and /CAS for generally controlling the DRAM.

Row and column address buffer 3 generates row address signals RA0 to RAi and column address signals CA0 to CAi in accordance with externally applied address signals A0 to Ai (note that i is an integer of at least 0). Generated signals RA0 to RAi and CA0 to CAi are respectively applied to row decoder 4 and column decoder 5.

Memory array 7 includes a plurality of memory cells arranged in a matrix and each storing 1-bit data. Each memory cell is arranged at a prescribed address determined by column and row addresses.

Row decoder 4 designates a row address of memory array 7 in response to row address signals RA0 to RAi applied from row and column address buffer 3. Column decoder 5 designates a column address of memory array 7 in response to column address signals CA0 to CAi applied from row and column address buffer 3. Sense amplifier+input/output control circuit 8 connects a memory cell at an address designated by row decoder 4 and column decoder 5 to one end of a pair of data input/output lines IOP. The other ends of a pair of data input/output lines IOP are respectively connected to input buffer 9 and output buffer 10.

In a writing mode, input buffer 9 applies externally input data Dj (note that j is a natural number) to the selected memory cell through the pair of data input/output lines IOP in response to an externally applied signal/W. In a reading mode, output buffer 10 externally outputs read data Qj from the selected memory cell in response to an externally input signal/OE.

Figure 12:
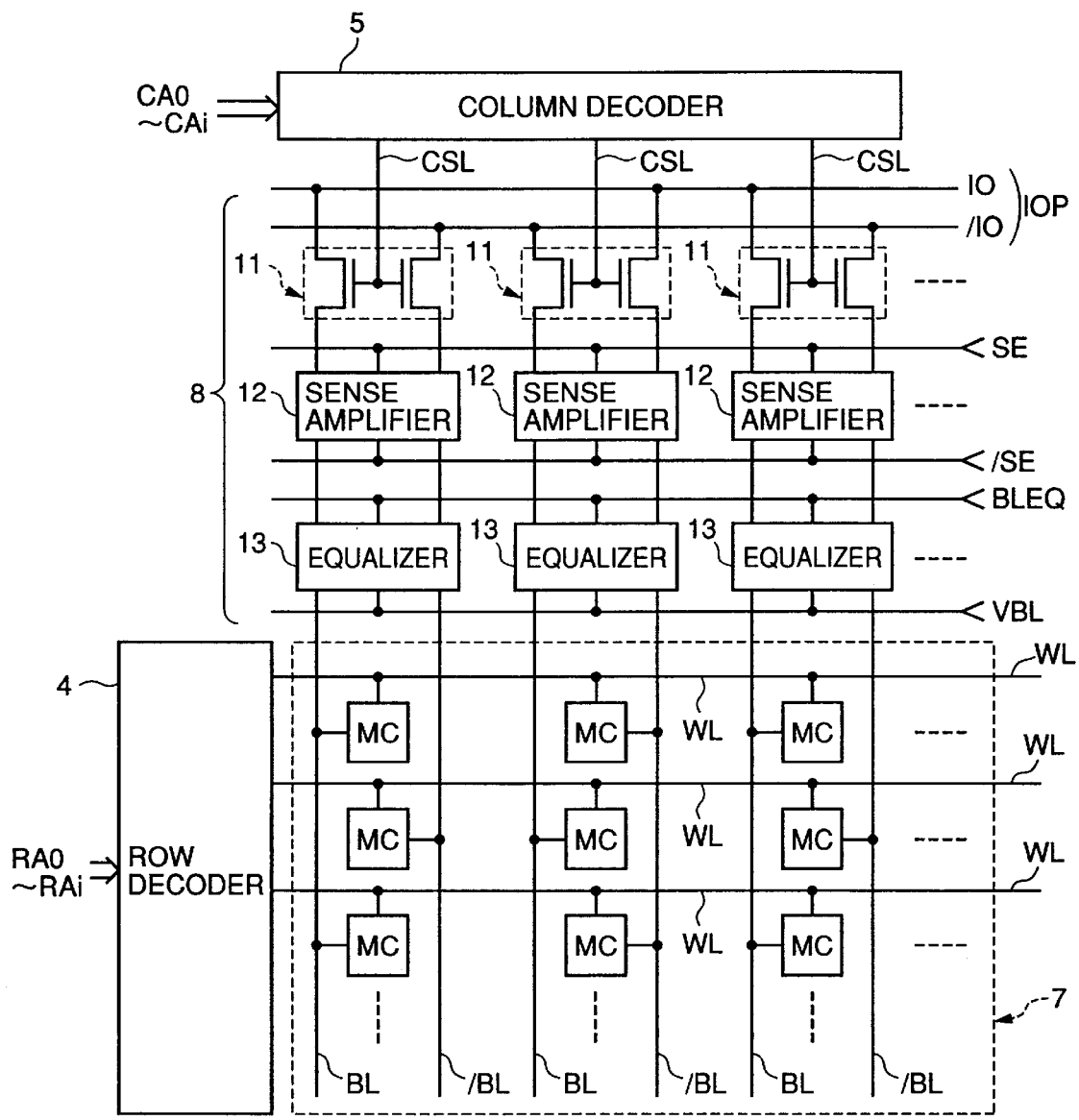
FIG. 12 is a circuit block diagram showing an arrangement of a memory mat of FIG. 11.

FIG. 12 is a circuit block diagram showing an arrangement of memory mat 6 of the DRAM shown in FIG. 11. Referring to FIG. 12, memory array 7 includes a plurality of memory cells MC arranged in a matrix, word lines WL arranged corresponding to rows, and a pair of bit lines BL, /BL arranged corresponding to columns. Each memory cell MC is of a well known type that includes an N channel MOS transistor for accessing and a capacitor for data storage. Word line WL transmits an output from row decoder 4 for activating memory cells MC in the selected row. The pair of bit lines BL, /BL is used for inputting/outputting data signals with respect to selected memory cells MC.

Sense amplifier+input/output control circuit 8 includes a pair of data input/output lines IO, /IO (IOP), as well as column selection gates 11 arranged corresponding to columns, a sense amplifier 12, and an equalizer 13. Column selection gate 11 includes a pair of N channel MOS transistors connected between a pair of bit lines BL, /BL and a pair of data input/output lines IO, /IO. A pair of N channel MOS transistors of each column selection gate 11 has its gate connected to column decoder 5 through column selection line CSL. In column decoder 5, if column selection line CSL rises to an "H" level of a selection level, the pair of N channel MOS transistors are rendered conductive, and the pair of bit lines BL, /BL and the pair of data input/output lines IO, /IO are connected.

Sense amplifier 12 amplifies a small potential difference between the pair of bit lines BL, /BL to an internal power supply voltage VCCS (<VCC) in response to the fact that sense amplifier activation signals SE, /SE have respectively attained to "H" and "L." Equalizer 13 equalizes potentials of the pair of bit lines BL, /BL to a bit line potential VBL (=VCCS/2) in response to the fact that a bit line equalize signal BLEQ has attained to "H" level of an activation level.

Thus, in the DRAM, various internal power supply potentials VPP, VCCS, and VBL are generated in accordance with external power supply potential VCC.

Figure 13:
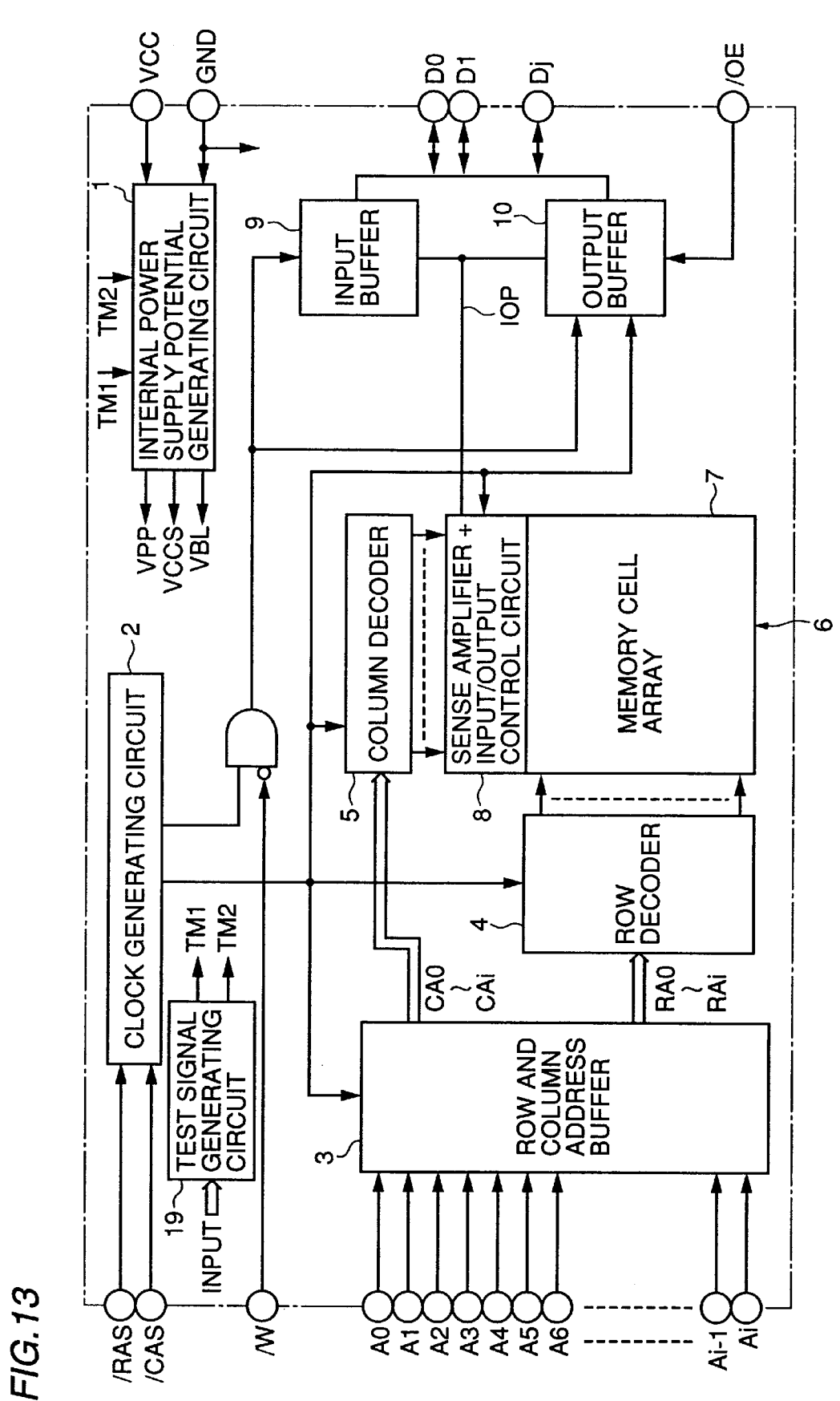
FIG. 13 is a block diagram showing a general arrangement of a DRAM provided with a test signal generating circuit according to one embodiment of the present invention.
Figure 14:
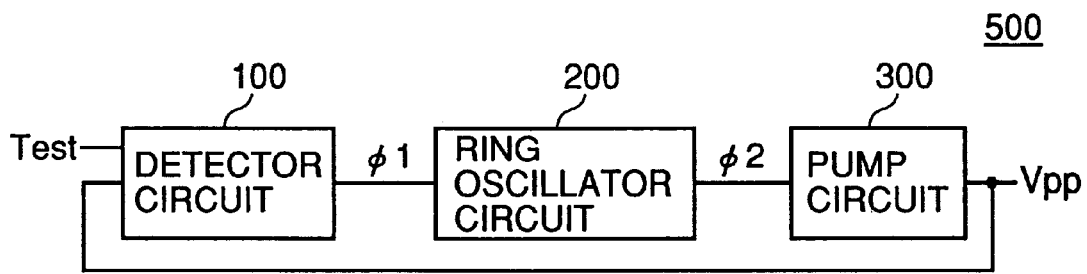
FIG. 14 is a block diagram showing a Vpp generating circuit.
Figure 15:
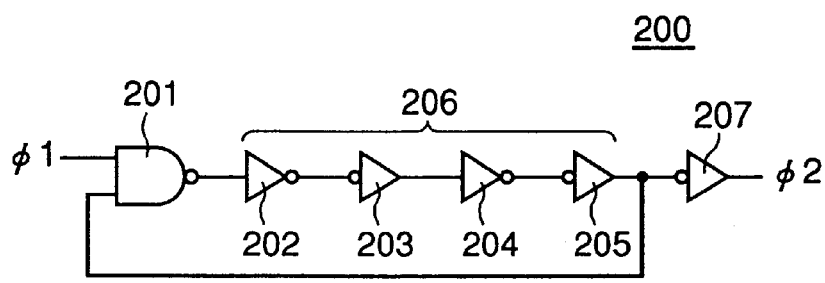
FIG. 15 is a diagram showing an exemplary ring oscillator circuit.
Figure 16:
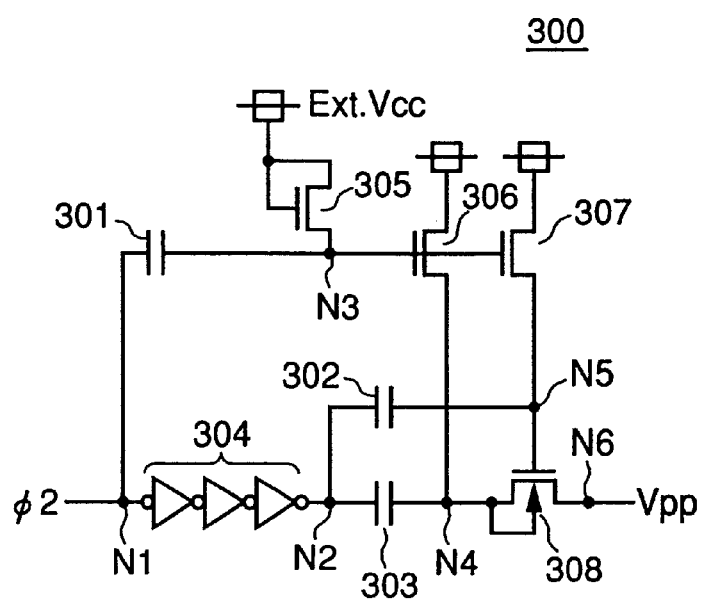
FIG. 16 is a diagram showing an exemplary pump circuit.
Figure 17:
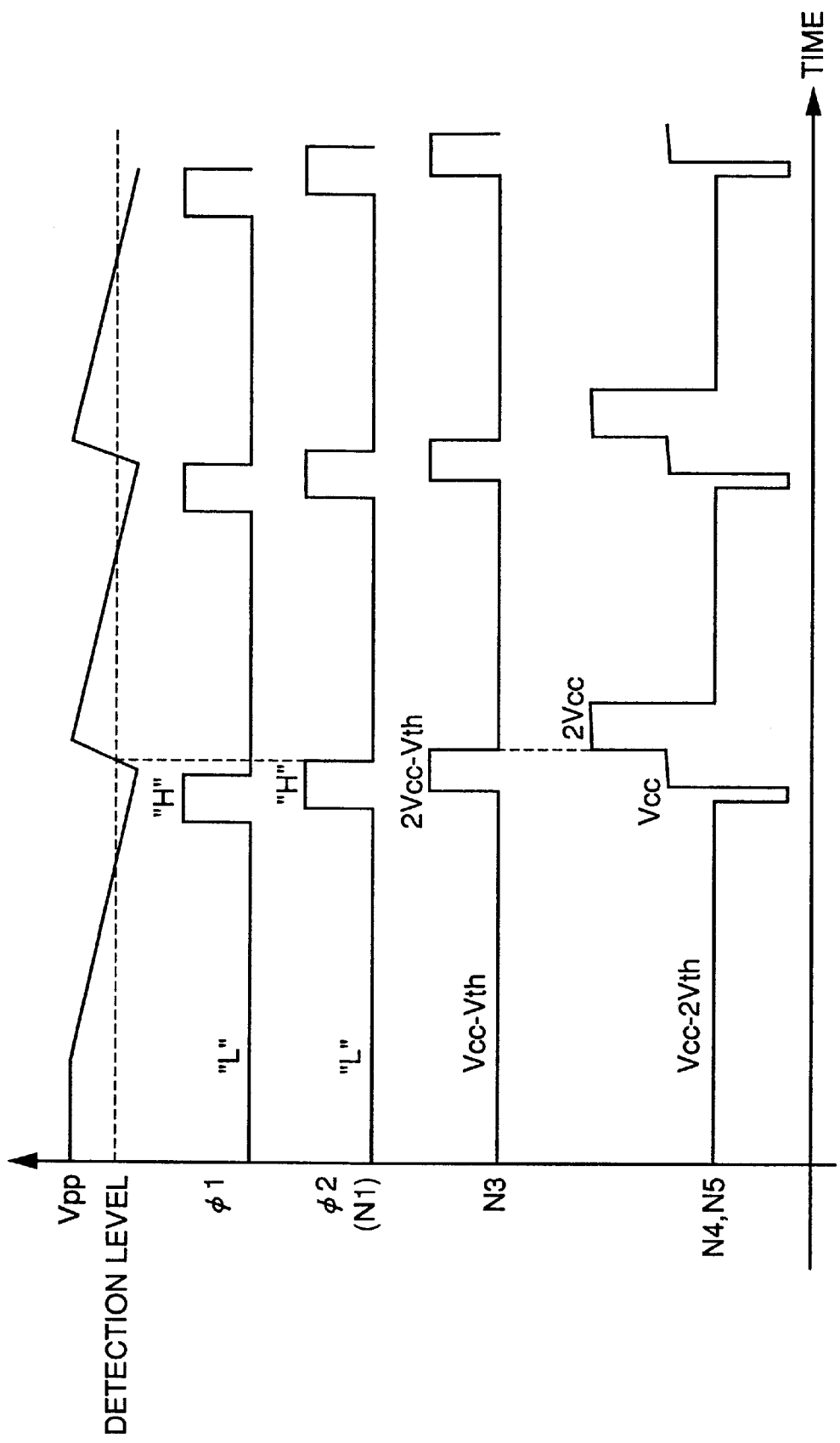
FIG. 17 is a diagram showing an exemplary operation waveforms of the Vpp generating circuit.

FIG. 13 shows test signal generating circuit 19 of the present invention added to the DRAM of FIG. 11.

Test signal generating circuit 19 outputs test signals TM1 and TM2 in accordance with an input to external pad 17 or external signal pin 18.

The Vpp generating circuit is provided in internal power supply potential generating circuit 1 of FIG. 11 or FIG. 13.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit, comprising:
    a memory cell array region including a plurality of memory cells arranged in rows and columns, a plurality of word lines arranged corresponding to said rows, and a plurality of bit lines arranged corresponding to said columns;
    a plurality of capacitors for generating a boosted voltage supplied to said memory cell array region; and
    a test circuit -controlling levels of stress applied to said plurality of capacitors.

2. The semiconductor integrated circuit according to claim 1, wherein said test circuit is controlled by a test signal.

3. The semiconductor integrated circuit according to claim 1, wherein said test circuit applies a predetermined voltage difference between electrodes of each of at least one of said plurality of capacitors in a test operation.

4. The semiconductor integrated circuit according to claim 2, wherein said test circuit controls the levels of stress applied to said plurality of capacitors in accordance with said test signal.

5. The semiconductor integrated circuit according to claim 2, wherein said test circuit simultaneously controls the levels of stress applied to said plurality of capacitors in accordance with said test signal.

6. The semiconductor integrated circuit according to claim 2, wherein said test signal is input from an external signal pin.

7. The semiconductor integrated circuit according to claim 2, wherein said test signal is input from an external pad.

8. The semiconductor integrated circuit according to claim 2, further comprising a test signal generating circuit internally generating said test signal.

9. The semiconductor integrated circuit according to claim 7, wherein said test signal generating circuit generates said test signal in accordance with an input from an external signal pin.

10. The semiconductor integrated circuit according to claim 7, wherein said test signal generating circuit generates said test signal in accordance with an input from an external pad.

* * * * *